United States Patent [19]

Dennard et al.

[11] 4,160,987

[45] Jul. 10, 1979

[54] FIELD EFFECT TRANSISTORS WITH POLYCRYSTALLINE SILICON GATE SELF-ALIGNED TO BOTH CONDUCTIVE AND NON-CONDUCTIVE REGIONS AND FABRICATION OF INTEGRATED CIRCUITS CONTAINING THE TRANSISTORS

[75] Inventors: Robert H. Dennard, Croton-on-Hudson; Vincent L. Rideout, Mohegan Lake, both of N.Y.

[73] Assignee: International Business Machines Corporation, Armonk, N.Y.

[21] Appl. No.: 804,200

[22] Filed: Jun. 6, 1977

Related U.S. Application Data

[63] Continuation of Ser. No. 686,969, May 14, 1976, abandoned.

[51] Int. Cl.² ............................................. H01L 27/02
[52] U.S. Cl. ........................................ 357/41; 29/571; 29/577 C; 29/578; 357/59
[58] Field of Search .................... 357/23, 41, 67, 50, 357/52, 54, 59; 307/238, 304; 29/571, 578, 577

[56] References Cited
U.S. PATENT DOCUMENTS

| | | | |
|---|---|---|---|
| 3,752,711 | 8/1973 | Kooi ........................................ | 357/23 |
| 3,811,076 | 5/1974 | Smith ....................................... | 307/238 |
| 3,830,657 | 8/1974 | Farrar ...................................... | 357/67 |
| 3,936,858 | 2/1976 | Seeds ....................................... | 357/23 |
| 3,958,323 | 5/1976 | De La Moneda ...................... | 357/23 |

*Primary Examiner*—W. Tupman
*Attorney, Agent, or Firm*—Pollock, Vande Sande & Priddy

[57] ABSTRACT

A field effect transistor (FET) with a unique gate structure is disclosed wherein the polycrystalline silicon (polysilicon) gate is self-aligned on its ends with respect to the conductive source and drain regions, and is self-aligned on its sides with respect to the nonconductive field isolation regions. The boundaries of these conductive and nonconductive regions determine the boundaries of the channel region of the FET. This double self-alignment feature results in a polysilicon gate, the lateral dimensions and location of which correlate directly with the lateral dimensions and location of the channel region of the FET. The unique gate fabrication technique employed according to the present invention comprises delineating lithographic patterns twice in the same polysilicon layer using the same oxidation barrier masking layer; whereby the first lithographic pattern delineates the FET device regions, and the next lithographic pattern forms the gate regions wherever the two patterns cross each other (i.e., wherever they delineate a common area).

44 Claims, 27 Drawing Figures

FIG. 6A
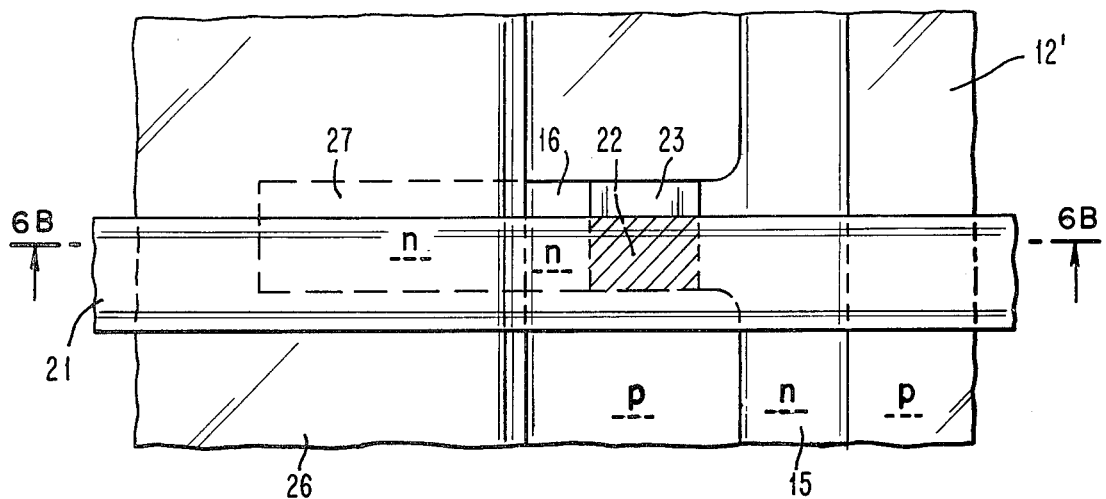
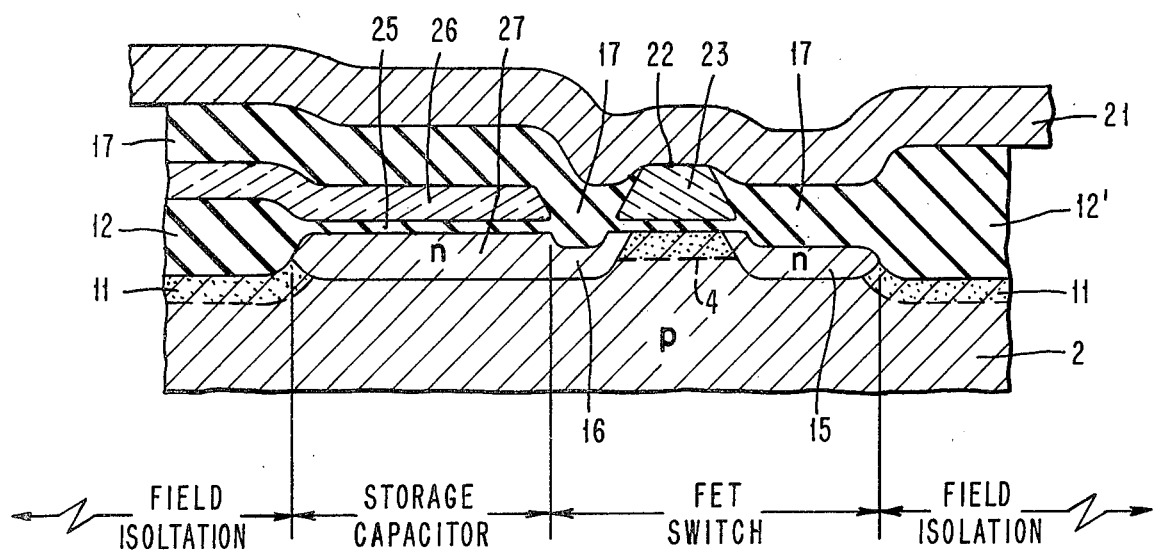
FIG. 6B

FIELD EFFECT TRANSISTORS WITH POLYCRYSTALLINE SILICON GATE SELF-ALIGNED TO BOTH CONDUCTIVE AND NON-CONDUCTIVE REGIONS AND FABRICATION OF INTEGRATED CIRCUITS CONTAINING THE TRANSISTORS

This is a continuation of application Ser. No. 686,969 filed May 14, 1976 now abandoned.

BACKGROUND OF THE INVENTION

The present invention relates generally to field effect transistors (FETs) and to the preparation of integrated circuits containing a plurality of the FETs. More particularly the present invention is related to a novel FET having a polycrystalline silicon (polysilicon) gate which is self-aligned with respect to both conductive and non-conductive regions, and to a method for fabricating such FETs and integrated circuits containing a plurality of such FETs. The present invention provides FETs which have a self-registering electrical connection between the polysilicon gate of the FET and a high electrical conductivity metallic interconnection line. The present invention requires only four basic lithographic (pattern delineating) masking steps to achieve the desired integrated circuit containing an array of FETs and the associated addressing, decoding, sensing, and/or clocking circuits which are positioned peripherally to the array.

The FET is an important electrical switching device in large scale integrated circuits. Such circuits may contain tens or even hundreds of thousands of FETs on a single semiconductor chip. Such chips typically measure less than one quarter of one inch on a side. The physical size (i.e., the lateral dimensions) of the FET switching device and the ease of electrically interconnecting a plurality of FETs are important factors in determining how closely devices may be packed into a given chip area. Thus, the degree of integration is in part determined by the device packing density. Accordingly, continuing work is being carried out to provide new masking and etching procedures which will yield the minimally smallest structure for a given lithographic feature size without significantly increasing the complexity of the fabrication process.

The choice of the conductive gate material for the FET influences the properties of the FET and the procedure for fabricating the FET. The most common gate materials are aluminum (a low-melting temperature metal) and polysilicon (a high-melting temperature non-metal). Gate materials less commonly used in the industry are high-melting temperature metals such as tungsten and molybdenum which, nevertheless, tend to become unstable after exposure to high processing temperatures. The present invention relates generally to FETs wherein the gate is of polysilicon.

In the fabrication of FETs, it is desirable to use polysilicon for the gate of the FET. As is well known in the art, polysilicon is an attractive FET gate material because of its ability to withstand high processing temperatures without degradation. Furthermore, polysilicon offers potentially higher gate oxide reliability than other gate materials. In addition, polysilicon can serve as an interconnection material. Moreover, conductive or semiconductive polysilicon can be converted to non-conductive (insulating) silicon dioxide by high temperature exposure to, for instance, oxygen or water vapor. Furthermore, polysilicon can be coated with an insulating layer such as a silicon dioxide or silicon nitride layer by chemical vapor deposition at high temperature. In addition, it is relatively easy to fabricate source and drain regions self-aligned with respect to the edges of a polysilicon gate. In the self-aligned gate technique, the polysilicon gate is delineated prior to forming the source and drain regions. The edges of the gate material and the edges of the field isolation regions serve as a mask for defining the boundaries of the diffused or ion implanted source and drain regions. A method of fabrication for ion implanted self-aligned source and drain regions is described in "Design of Ion-Implanted MOSFET's with Very Small Physical Dimensions" by R. H. Dennard et al, IEEE J. Solid-State Circuits, Vol. SC-9, pp. 256-268 (October 1974).

In known polysilicon gate FETs, the sides of the channel region are defined by the thick insulation region, commonly referred to as the field isolation region, and the polysilicon gate extends up onto (i.e., overlaps onto) the field isolation regions. The field isolation is typically of silicon dioxide and can exist above, or may be partially or fully recessed into the semiconductive substrate with respect to the source and drain regions. The recessed oxide isolation technique, which is known in the art, requires an oxidation barrier masking layer to prevent oxidation in the FET device regions. This mask can also serve as a blocking mask for the formation of a doped region that serves as a parasitic channel stopper. By introducing extra impurities of the same conductive type as the substrate, parasitic conductive channels can be prevented from forming under or along the side of the recessed oxide isolation region. An example of a recessed oxide fabrication technique which discloses an ion implanted channel stopper is U.S. Pat. No. 3,899,363 to Dennard, Rideout, and Walker.

In FET structures known in the art, the sides of the channel are determined by the field isolation oxide and the polysilicon gate overlaps onto this field oxide. This overlap is necessary because the field isolation lithographic pattern and the polysilicon gate lithographic pattern cannot be automatically registered with respect to one another. Consequently, a misregistration tolerance (i.e., a pattern overlap) must be provided to insure that the source and drain do not electrically short together. This required gate overlap undesirably consumes extra area. Furthermore, at the edges of the polysilicon, a topological step occurs which can lead to coverage problems for subsequently fabricated insulation layers and metallic interconnection lines. An example of the polysilicon overlap and the resultant step in the cross section is illustrated in FIG. 1 of "Uses of Ion Implantation in Advanced MOS Field-Effect Transistors", ECS Fall Meeting Extended Abstracts, Volume 75-2, pp. 326-329, October 1975 by Dennard, Rideout, Yu, and Gaensslen.

Therefore, an object of the present invention is to provide FETs wherein the polysilicon gate does not overlap onto the field oxide isolation. A further object of the present invention is to provide FETs of reduced overall area without increasing the number of basic lithographic masks used to obtain such. Still another object of the present invention is to provide FETs with a polysilicon gate that is self-aligned with respect to both the conductive source and drain regions on its ends, and to the nonconductive field isolation regions on its sides. This double self-alignment feature results in a polysilicon gate, the lateral dimensions and location of which correlate directly with the lateral dimensions and location of the channel region of the FET and, therefore, the polysilicon gate material neither overlaps nor underlaps the field isolation regions.

FET integrated circuits are fabricated using a sequence of lithographic masking, exposing, and etching steps. In order to delineate the field isolation; gates of the FET; contact holes to gates, sources, and drains; and metallic interconnection pattern, a minimum of four basic lithographic pattern delineations are generally required. The lithographic masking steps involved in preparing integrated circuits are among the most critical. The lithographic masking steps require high precision in registration (i.e., in relative mask-to-mask alignment) and extreme care in execution. If the misregistration from mask-to-mask is too large, electrical shorts or opens in the integrated circuit will appear and the circuit will not function correctly. Consequently, a misregistration tolerance must be provided to allow for mask-to-mask alignment difficulties. All lithographic exposure systems have a finite misregistration due to the inherent physical limitations that naturally occur in an electromechanical system. Furthermore, each additional lithographic masking step in a process introduces possible surface damage due to mask defects, and increases mask-to-mask registration problems that decrease the processing yield and, accordingly, significantly increase the fabrication cost. A basic objective in FET integrated circuit fabrication is to provide a mask sequencing and associated geometrical layout technique that will result in structures which are more tolerant of mask-to-mask misregistration and yet which provide FET structures of small overall size, without increasing the number of lithographic masking steps.

Accordingly, an object of the present invention is to provide a technique which is more tolerant of mask-to-mask-misregistration and which also provides relatively small area FETs. Another object of the present invention is to provide a fabrication process for producing FET integrated circuit arrays which requires a minimum number of lithographic masking (pattern delineating) steps.

Another object of the present invention is to provide an FET with a field isolation oxide that is recessed with respect to the upper surface of the FET source and drain regions. The boundaries of the field oxide and the boundaries of the FET gate are used to define the boundaries of the source and drain regions.

In the polysilicon gate FET technology, the polysilicon regions must be electrically connected to highly conductive metallic interconnection lines. Generally, this connection has been made by growing and/or depositing an insulating layer over the gate, and then delineating and etching a contact hole or via through the insulating layer. Such a method of providing electrical connection between the polysilicon gate and the metallic interconnection line suffers from the problem that the polysilicon lithographic pattern and the via lithographic pattern cannot be perfectly registered with respect to one another. Similarly, the via lithographic pattern and the metallic interconnection line lithographic pattern also cannot be perfectly registered with respect to one another. A fabrication sequence which eliminates this particular problem of contact alignment between the polysilicon gate and the metallic interconnection line is discussed by Kalter et al in IBM Technical Disclosure Bulletin, Volume 14, No. 10, p. 3176, March 1972, and by Rideout in IBM Technical Disclosure Bulletin, Vol. 17, No. 9, p. 2802, February 1975.

Both IBM Technical Disclosure Bulletin Publications describe polysilicon gates that overlap onto the field isolation regions. The fabrication process suggested by Kalter et al provides a polysilicon gate FET in which a metal line is "self-registered" with respect to a polysilicon gate, wherein oxidation over the polysilicon gate is prevented by an oxidation barrier gate-masking layer. When the oxidation barrier layer is removed, the entire gate area is revealed for contacting. A metal word line such as aluminum that crosses the polysilicon gate will provide an electrical connection to that gate. Because the entire gate area is revealed, the metal word line and the polysilicon gate advantageously do not need to be precisely registered with respect to each other in order to make electrical connection. Much more precise registration is required, however, when the metal line must contact the polysilicon gate via a conventional contact hole etched through an oxide layer that exists over the gate.

Therefore, another object of the present invention is to provide an FET with a self-registering or misregistration tolerant contact between the polysilicon gate and the high electrical conductivity metallic interconnection line. The electrical contact between the gate and the interconnection line is made over the gate which is located directly above the channel region of the FET. Vertical placement of the metallic line contact region over the gate and over the channel yields an FET with an overall area smaller than that possible with other known FET fabrication techniques. The number of basic lithographic masking steps, however, is no greater than that used in other FET integrated circuit fabrication processes.

Still another object of the present invention is to provide a highly planar surface topology upon which to delineate the metallic-type interconnection pattern. Because the polysilicon gate material abuts the field isolation, the upper surface of the field isolation oxide can be made at the same level as the upper surface of the polysilicon gate, consequently the planarity of the structure is enhanced over previously known FET structures in which the polysilicon gate material overlaps onto the field isolation.

A still further object of the present invention is to provide a plurality of FETs of very high packing density interconnected to form an integrated circuit, wherein the FETs have been formed on the same semiconductive substrate.

In addition, it is an object of the present invention to provide FET integrated circuit arrays having all of the following desirable aspects:

(1) thick field isolation located between FETs of the array;

(2) field isolation recessed with respect to upper surface of the source and drain regions of the FET;

(3) doped polysilicon gate self-aligned with respect to the field isolation region;

(4) doped source and drain self-aligned with respect to the polysilicon gate;

(5) a metallic-type high electrical conductivity interconnection line;

(6) self-registering electrical connection between the doped polysilicon gate and the metallic-type high electrical conductivity interconnection line;

(7) contact holes or vias for connecting source and drain regions to interconnection lines; and (8) electrical connection to semiconductive substrate.

A further object of the present invention is to provide a fabrication process which requires only four basic lithographic masking steps in order to prepare integrated circuit arrays containing FETs having all of the above-described desirable characteristics.

SUMMARY OF THE INVENTION

The present invention is concerned with a field effect transistor (FET) having the sides of its gate electrode self-aligned with respect to the boundaries of the field insulator, and wherein the gate electrode neither overlaps nor underlaps the field insulator; and to a method for fabricating a semiconductor integrated circuit comprising a semiconductive substrate having at least one such transistor formed therein. Each FET has source, drain, and channel regions and the conductive source and drain regions are self-aligned with respect to the ends of the gate conductor. Electrical connections can be made to source, drain, gate, and substrate regions for the purpose of applying or obtaining electrical signals. In an integrated circuit, the FET generally acts as a switch to allow or prevent electrical signals from being conducted, or as an amplifier to magnify weaker signals.

A further aspect of the present invention is concerned with an integrated circuit array containing a plurality of the FETs described hereinabove.

The FETs of the present invention can be used to form an integrated circuit array such as a random access memory array, and to form addressing, decoding, sensing, and clocking circuits positioned peripheral to the array of FETs. These peripheral FET circuits are generally fabricated on the same integrated circuit chip and with the same fabrication process as is used for the array of FETs.

Another aspect of the present invention is concerned with an FET one-device memory cell of an FET switch of the type described hereinabove and a charge storage capacitor.

Another aspect of the present invention is concerned with integrated circuit arrays containing a plurality of the above-described FET one-device memory cells.

A further aspect of the present invention is concerned with a method for fabricating FETs with sides of the gate conductor self-aligned with respect to the field insulator, and the ends of the gate conductor self-aligned with respect to the source and drain regions.

The fabrication method to be described hereinbelow provides an FET which is surrounded by a relatively thick oxide isolation region, commonly referred to as the field oxide. The field oxide electrically isolates one FET from other FETs which are present on the same semiconductive substrate. The field oxide is generally formed by thermal oxidation of the semiconductive substrate after the first mask pattern delineation. The field isolation oxide is partially or fully recessed into the semiconductive substrate with respect to the upper surface of the source and drain regions.

The gate of the FET is of polysilicon and is generally doped to the same conductive type as the source and drain. According to the present invention, the FET device regions and the gate regions are fabricated by delineating lithographic patterns twice in the same polysilicon layer using the same oxidation barrier masking layer. The first lithographic pattern delineates the FET device regions as distinguished from the field isolation regions and the next lithographic pattern forms the gate regions wherever the two patterns cross each other (i.e., wherever they delineate a common area), thereby self-aligning the boundaries of the field isolation and the gate with respect to one another. The doped source and drain regions are formed by diffusing or ion implanting impurities into the semiconductive substrate and using the field isolation regions and the polysilicon gate regions as masks to prevent impurities from entering the substrate beneath the field isolation and beneath the gate regions. In this manner the boundaries of the source and drain are self-aligned with respect to the ends of the polysilicon gate of the FET.

In order to form an array of randomly addressable FETs, electrically conductive lines are connected to FET gates in the array. These lines must cross over and be electrically insulated from the doped source and drain regions of the FETs in the array. This is achieved by thermally growing a silicon dioxide layer over the sources and drains and over all other areas of the structure except for the gate regions which are protected by the oxidation barrier layer. Subsequently removing the oxidation barrier layer from the gate leads to a "self-registering" gate contact area for connection to an electrically conductive interconnection line. Other access lines of the array may be formed by extending the sources (or drains) of the FET and connecting many such sources (or drains) together. Sources (or drains) can also be connected together by using a metallic interconnection line and contact holes or "vias" through the insulating layer to provide access to source (or drain) regions.

A method with which the present invention is concerned is for fabricating an integrated circuit containing an array of FETs having recessed field oxide isolation between FETs, and wherein FETs of the array have a channel region; a gate insulator; a doped polysilicon gate with sides self-aligned with respect to the field oxide isolation in the width direction and the gate neither overlapping nor underlapping the field oxide isolation; source and drain regions being self-aligned to the ends of the gate in the length direction; insulation over the source and drain but not over the gate; metallic-type high electrical conductivity interconnection line; and self-registering electrical connection between the gate and the interconnection line which comprises:

(A) providing a semiconductive substrate of a first conductive type containing active impurities of a first conductive type;

(B) providing an insulator layer on said substrate, which insulator layer is to be subsequently delineated to provide the gate insulator;

(C) depositing and doping a layer of polycrystalline silicon above the insulator layer;

(D) depositing an oxidation barrier layer above said polycrystalline silicon layer;

(E) delineating by masking and etching first predetermined polycrystalline silicon regions to provide the FET device area;

(F) growing in the etched regions isolation oxide recessed into the substrate to provide insulating field oxide regions between FETs of the array;

(G) delineating by again masking and etching a predetermined pattern in the remaining polysilicon regions to provide polycrystalline silicon gate regions of the FETs;

(H) thermally diffusing or ion implanting active impurities of a second and opposite type into predetermined regions of the semiconductive substrate to provide FET source and drain regions;

(I) thermally growing a silicon dioxide insulating layer over regions of the structure but not over the polysilicon FET gates which are still protected by an oxidation barrier layer;

(J) removing the existing oxidation barrier layer from over the FET gates by use of an etchant;

(K) delineating contact holes to provide vias for achieving electrical connection between interconnection lines and FET source and drain regions; and (L) depositing and delineating a metallic-type high conductivity electrical interconnection pattern that makes electrical connection to the polysilicon FET gates, and to FET sources and drains.

Electrical connection to the semiconductive substrate can be made by delineating contact holes to provide vias either prior to, subsequent to, or along with delineating contact holes to provide vias for achieving electrical connection to the source and drain regions. Also electrical connection can be made by applying to the backside or bottom of the semiconductive substrate a metallic-type high electrical conductivity material.

The fabrication steps described above make it possible to provide the desired array of FETs and peripheral FET circuits with only four basic lithographic masking steps. The four basic lithographic masking (pattern delineating) fabrication steps employed are as follows:

(1) delineating device area and field isolation area pattern;

(2) delineating FET gate pattern;

(3) delineating contact hole pattern to provide vias to source and drain regions; and (4) delineating high-conductivity interconnection line pattern.

It is noted that polysilicon gates are formed wherever above-described pattern (2) overlaps pattern (1) (i.e., wherever they define a common area). It is further noted that mask pattern (3) above may also be used to delineate contact holes to provide vias to substrate regions when desired.

The present invention is also concerned with an integrated circuit comprising an array of FETs prepared by the method described above and associated circuits peripheral to the array of FETs.

Also, the present invention is directed to a method for fabricating an integrated circuit containing an array of FET one-device memory cells having recessed field oxide isolation between cells and wherein memory cells of the array have a channel region; a gate insulator; a doped polysilicon gate; a polysilicon upper storage capacitor electrode; a capacitor insulator; a doped lower capacitor electrode beneath the polysilicon upper capacitor electrode; self-alignment between field oxide isolation and the sides of the gate in the width direction, the gate neither overlapping nor underlapping the field oxide isolation; source and drain regions being self-aligned to the ends of the gate in the length direction; insulation over the source and drain but not over the gate; metallic-type high electrical conductivity interconnection line; and self-registering electrical connection between the gate and the interconnection line which comprises:

(A) providing a semiconductive substrate of a first conductive type containing active impurities of a first conductive type;

(B) providing insulator layer on said substrate, which insulator layer is to be subsequently delineated to provide the gate insulator;

(C) depositing and doping a first layer of polysilicon above the insulator layer;

(D) depositing an oxidation barrier layer above said first polysilicon layer;

(E) delineating by masking and etching first predetermined polysilicon regions to provide the device area;

(F) growing in the etched regions isolation oxide recessed into the substrate to provide insulating field oxide regions between memory cells of the array;

(G) delineating by masking and etching second predetermined pattern in the remaining regions of said first polycrystalline silicon layer to provide polycrystalline silicon gate regions of the memory cells;

(H) thermally diffusing or ion implanting active impurities of a second and opposite type into preselected regions of the semiconductive substrate to provide FET source regions, FET drain regions, and lower electrodes of the storage capacitors;

(I) providing a storage capacitor insulator;

(J) then depositing and doping a second and subsequent layer of polysilicon above the capacitor insulator;

(K) then delineating the second and subsequent polysilicon layer to provide a predetermined pattern of polysilicon upper electrode regions above the corresponding doped lower electrodes of the storage capacitors;

(L) thermally growing a silicon dioxide insulating layer over regions of the structure but not over the polycrystalline silicon FET gates which are still protected by an oxidation barrier layer;

(M) removing the existing oxidation barrier layer from over the FET gates by use of an etchant;

(N) delineating contact holes to provide vias for achieving electrical connection to polycrystalline silicon upper capacitor electrodes; and to source and drain regions in circuits peripheral to the array of memory cells;

(O) depositing and delineating a metallic-type high-conductivity electrical interconnection pattern that makes electrical connection to the polycrystalline silicon FET gates in the array of memory cells; to polycrystalline silicon upper capacitor electrodes; and to FET sources, gates, and drains in circuits peripheral to the array of memory cells; and (P) providing electrical connection to said semiconductive substrate.

The particular fabrication steps described above makes it possible to provide the desired array of FET one-device memory cells and peripheral FET circuits with only five basic lithographic masking steps. The five basic lithographic masking (pattern delineating) fabrication steps employed are as follows:

(1) delineating device area and field isolation area pattern;

(2) delineating FET gate pattern;

(3) delineating upper storage capacitor electrode pattern;

(4) delineating contact hole pattern to provide vias to polysilicon upper storage capacitor electrodes and to source and drain regions; and (5) delineating high-conductivity interconnection line pattern.

It is noted that polysilicon gates are formed wherever above-described pattern (2) overlaps pattern (1) (i.e., wherever they define a common area). It is further noted that mask pattern (4) above may also be used to delineate contact holes to provide vias to substrate regions when desired.

The present invention is also concerned with an integrated circuit comprising an array of FET one-device memory cells prepared by the method described above and associated circuits peripheral to the array of memory cells.

BRIEF DESCRIPTION OF THE DRAWINGS

FIG. 6A illustrates a top view of an FET one-device cell of the present invention wherein the polysilicon gate of the FET switch does not overlap the field isolation.

FIG. 6B shows a cross-sectional view through the FET one-device cell along the line indicated in FIG. 6A.

FURTHER DESCRIPTION OF THE DRAWINGS

Figure 1A:
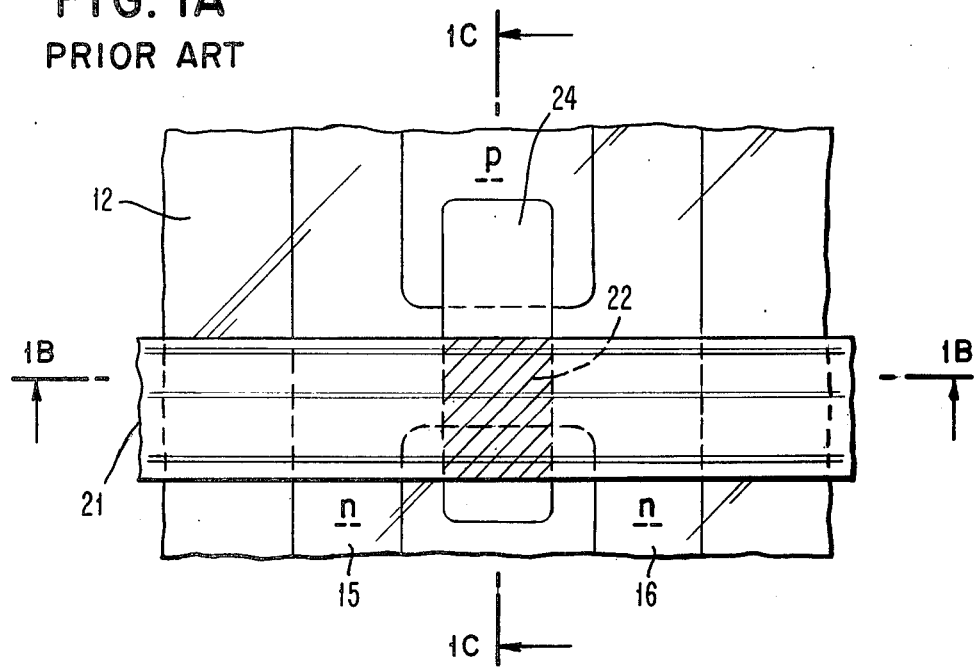
FIG. 1A illustrates a top view of an FET with an overlapping polysilicon gate and a misregistration tolerant gate contact made according to the method suggested by Kalter et al referred to hereinabove.

Referring to FIG. 1A there is shown a top view of an FET made according to the method of Kalter et al in IBM Technical Disclosure Bulletin, Volume 14, No. 10, page 3176, March 1972, that provides an FET in which a metallic interconnection line 21 makes a "self-registered" electrical connection 22 to a polysilicon gate 24. In the fabrication process disclosed by Kalter et al, oxidation over the polysilicon gate is prevented by an oxidation barrier masking layer. When the oxidation barrier layer is removed by an etchant, the entire gate area is revealed for contacting. A metallic interconnection line 21 such as one of aluminum that crosses the gate will provide an electrical connection 22 to the gate 24. Because the entire polysilicon area is revealed, the metal line and the polysilicon gate lithographic patterns advantageously do not need to be precisely registered with respect to each other in order to make electrical connection. Much more precise registration is required, however, when the metal line must contact the polysilicon gate via a conventional contact hole etched through an oxide layer that exists over the gate.

Figure 1B:
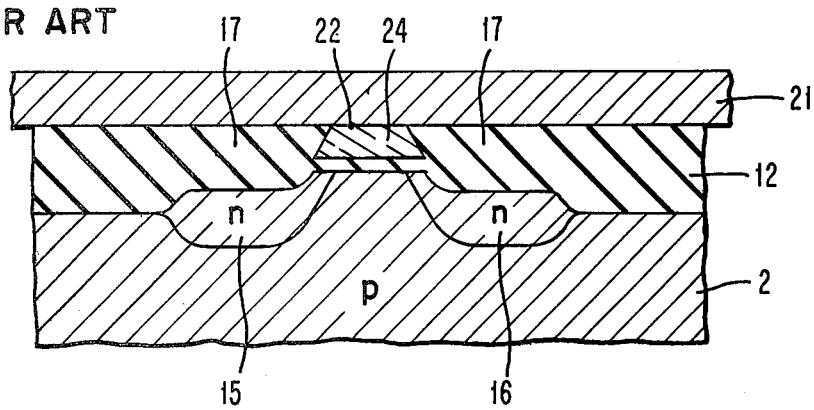
FIGS. 1B and 1C show cross sectional views through the overlapping gate FET along the lines indicated in FIG. 1A.
Figure 1C:
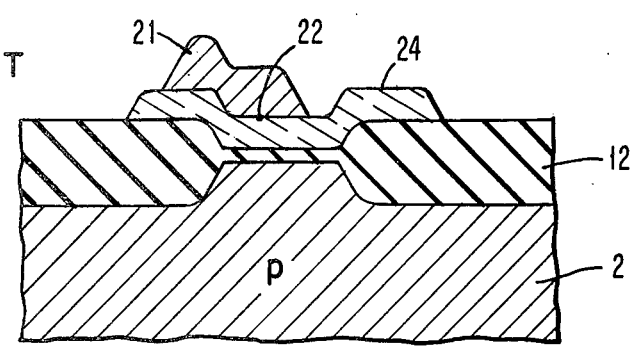

As illustrated in FIG. 1A, the field isolation and the polysilicon gate 24 are not self-aligned, and hence the gate material must overlap onto the field isolation oxide 12 to prevent the source 15 and drain 16 from shorting together. When viewed in cross section, the FET of FIG. 1A exhibits a highly planar topology along the channel from source to drain (see FIG. 1B), but not across the channel (see FIG. 1C) due to the overlapping gate structure. This nonplanar topology can lead to fabrication difficulties. For example, the metallic interconnection line 21 must be thick enough to accommodate the undulating polysilicon gate layer and to avoid thinning of or breaks in the metallic line (see FIG. 1C). In addition, the resist layer used to transfer the metallic interconnection layer pattern from a master mask to the substrate will experience the same undulations, and thickness variations may occur in the resist which is usually applied onto a spinning substrate. This can lead to a loss of resolution in edge definition for metal lines which may disadvantageously require wider line widths with a resultant reduction in device packing density. Furthermore, a nonplanar surface can cause a loss of resolution in edge definition due to variations in the depth of field exposed. The lithographic delineation problems associated with semiconductor surfaces that are not truly planar become more acute as attempts are made to scale down FETs to smaller and smaller dimensions.

Figure 2A:
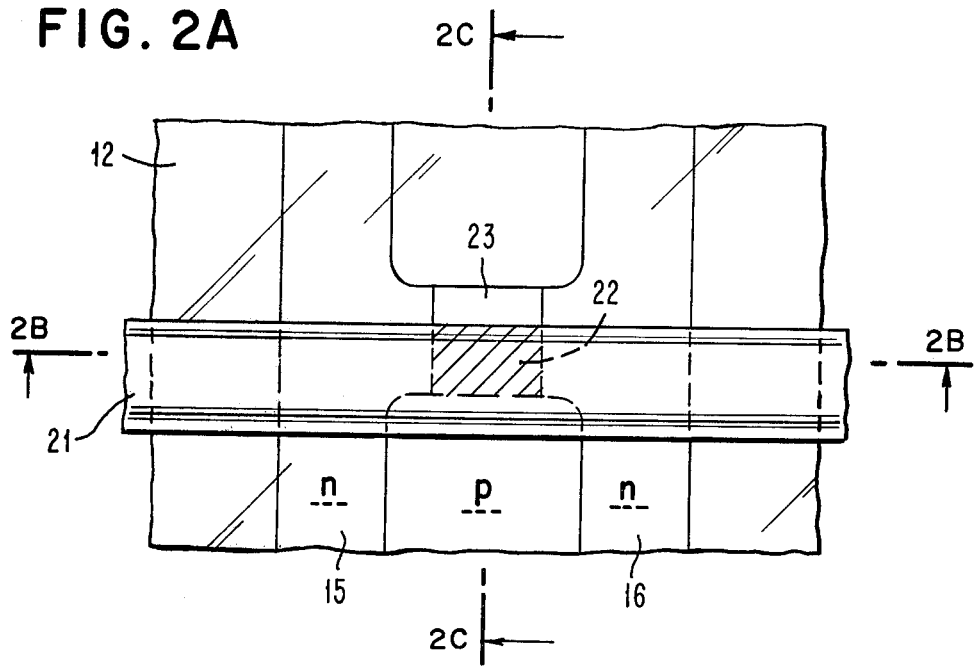
FIG. 2A illustrates a top view of an FET of the present invention wherein the polysilicon gate does not overlap the field isolation.
Figure 2B:
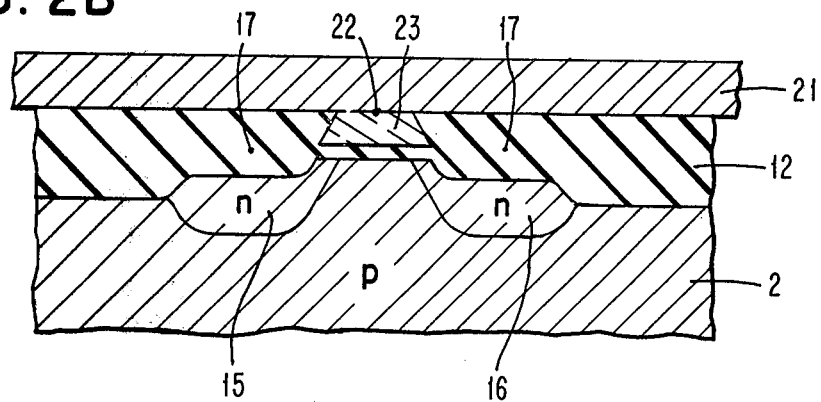
FIGS. 2B and 2C show cross sectional views through the overlapping gate FET along the line indicated in FIG. 2A.

FIG. 2A shows a top view of an FET of the present invention having a "self-registering" electrical connection 22 between the polysilicon gate 23 and the metallic interconnection line 21 and wherein the polysilicon gate 23 is self-aligned with respect to the field oxide isolation 12 in its width direction and does not overlap the field isolation oxide. In constrast to the device shown in FIG. 1A, the sides of the polysilicon gate 23 shown in FIG. 2A are self-aligned with respect to the boundaries of the field isolation and, therefore, the gate does not overlap onto the field isolation. When viewed in cross section, the new FET structure of FIG. 2A exhibits a highly planar topology in all directions (see FIGS. 2B and 2C). This highly planar topology relieves the lithographic delineation problems described above and also leads to an FET with a smaller gate area and a smaller total area than that of the device shown in FIG. 1A.

Figure 3A:
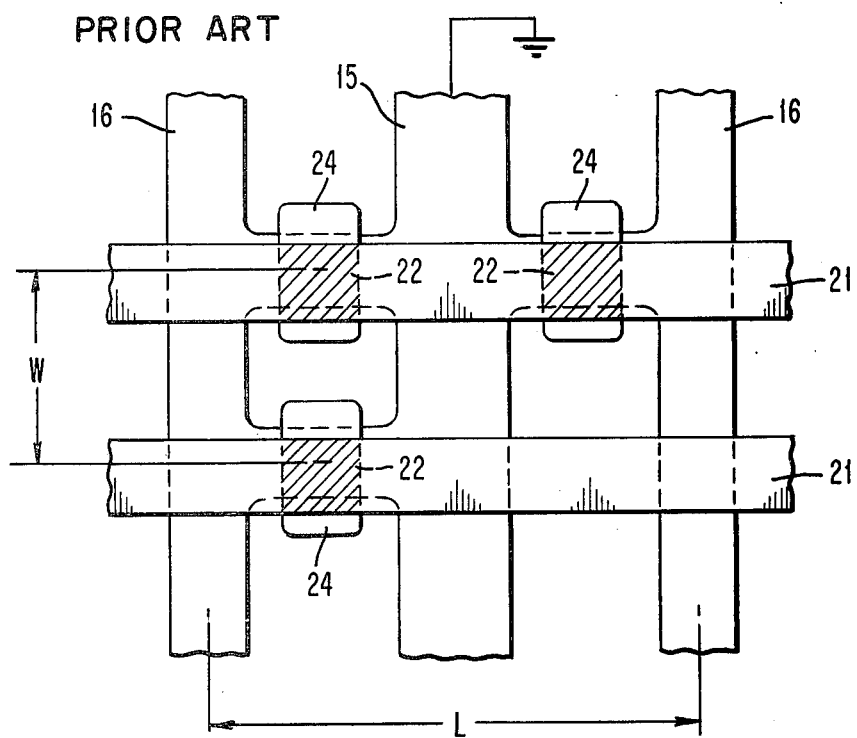
FIG. 3A shows a fragment of an array of an FET integrated circuit made using FETs with overlapping gates and misregistration tolerant gate contacts.
Figure 3B:
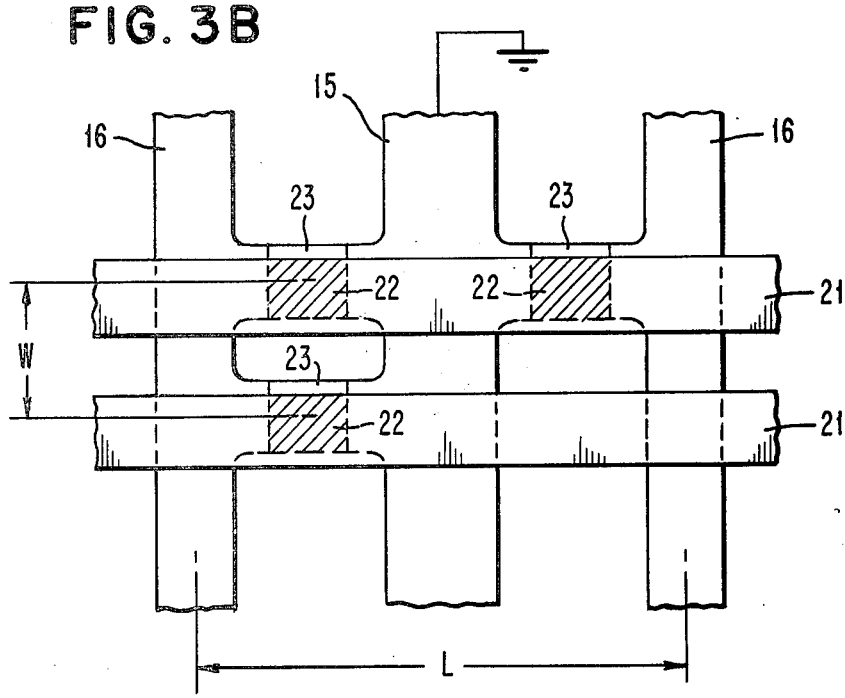
FIG. 3B shows a fragment of an array of an FET integrated circuit of this invention made using FETs with nonoverlapping gates and misregistration tolerant gate contacts.

The smaller FET structure of the present invention leads to integrated circuits with a higher device packing density as illustrated by comparing FIGS. 3A and 3B which show fragments of an array of an FET integrated circuit. FIG. 3A is a fragment of an FET array fabricated according to the overlapping gate method of Kalter et al, and FIG. 3B is a fragment of an FET array of the present invention wherein the gate does not overlap the field isolation. Both structures have self-registering electrical connections between the gate and the metallic interconnection line. The fragments shown in FIGS. 3A and 3B are exemplary of fragments of a programmable logic array or of a read-only memory array. Both fragments provide the same electrical function but the fragment shown in FIG. 3B as employed in the present invention is smaller in the width dimension, W, when fabricated with the same minimum lithographic feature size as that of FIG. 3A. The two fragments are the same in the length dimension, L, and hence the fragment of FIG. 3B is smaller in total area due to the nonoverlapping gate feature of the present invention.

DESCRIPTION OF PREFERRED EMBODIMENTS

For convenience, the discussion of the fabrication steps of the present invention is directed to the preferred aspect of employing a p-type silicon substrate as the semiconductive substrate and n-type impurities as the diffused or implanted dopant impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic-type interconnection lines" or "high-conductivity interconnection lines" refer to metal lines such as aluminum as well as to nonmetallic materials (e.g., highly doped polysilicon or intermetallic silicides) which nevertheless can have electrical conductivities sufficiently high enough to be useful in integrated circuits. Also, the terms "lines" and "stripes" are used interchangeably in reference to long, narrow, lithographically delineated regions. Moreover, the terms "polysilicon" and "polycrystalline silicon" are used herein interchangeably as in the prior art. Also, when reference is made to impurities of a "first type" and to impurities of the "second type", it is understood that the "first type" refers to n- or p-type impurities and "second type" refers to the opposite conductivity type. That is, if the "first type" is p, then the "second type" is n. If the "first type" is n, then the "second type" is p.

Figure 4A:
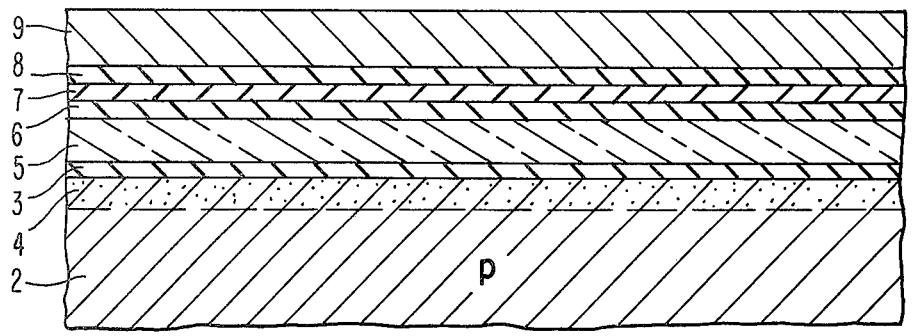
FIGS. 4A–4I are cross-sectional views of the FET in various stages of fabrication through the nonoverlapping gate FET of the present invention along the lines indicated in FIG. 5.

Referring to FIG. 4A, there is shown a fragment of the initial structure of the invention generally known as 1. A p-type semiconductive silicon substrate 2 having an desired crystallographic orientation (e.g., <100>) is prepared by slicing and polishing a p-type silicon boule grown in the presence of a p-type dopant such as boron following conventional crystal growth techniques. Other p-type dopants for silicon include aluminum, gallium, and indium.

A thin gate insulator 3 is grown on or deposited onto the silicon substrate 2. This gate insulator, which is about 200 to 1000 Å thick, is preferably of silicon dioxide and is preferably formed by thermal oxidation of the silicon surface at 1000° C. in the presence of dry oxygen. The p-type doping near the silicon surface is increased by a low energy ion implantation, or by diffusion, of a p-type dopant. This extra surface doping layer 4, referred to as channel doping, is approximately 1000 to 5000 Å deep and serves to increase the gate threshold voltage of the FET. The use of additional p-type doping for threshold adjustment is known in the art and is described, for example, by Rideout et al, in "Device Design Considerations for Ion Implanted n-Channel MOSFETs", IBM Journal of Research and Develop., Volume 19, pp. 50–59, January 1975. The channel doping is preferably formed by ion implantation of boron. The implantation may be performed before or preferably after forming the gate insulator. The boron ion implantation energy is about 50 KeV and the dosage is approximately $2 \times 10^{12}$ cm$^{-2}$.

A layer of polysilicon 5 is then deposited. The polysilicon layer is approximately 1500 to 5000 Å thick, and may be formed by chemical-vapor deposition. The polysilicon layer is doped with an n-type dopant such as arsenic, phosphorus, or antimony by one of several conventional techniques. Preferably, the polysilicon is doped with phosphorus and preferably uses the technique of depositing a POCl$_3$ layer and heating it to approximately 870° C. to drive the phosphorus into the polysilicon making it n-type. After this the residual of the POCl$_3$ layer is removed by etching the wafer in buffered hydrofluoric acid. A thin surface protection layer of silicon dioxide 6 about 50 to 200 Å thick can then be grown on or deposited onto the polysilicon layer to prevent a subsequently deposited oxidation barrier layer 7 from reacting with the polysilicon and thereby rendering it difficult to later remove the oxidation barrier layer.

An adherent oxidation barrier layer 7 of a nonoxidizing material such as silicon nitride, aluminum nitride, boron nitride, aluminum oxide, or silicon carbide is then deposited. Preferably the layer 7 is of silicon nitride and is approximately 500 to 1000 Å thick. The layer 7 may be deposited by conventional chemical-vapor deposition techniques. An additional layer of silicon dioxide 8 is then deposited. The silicon dioxide layer 8 is approximately 500 to 1000 Å thick and may be formed by chemical vapor deposition.

Layer 8 serves as an etching mask to delineate the layer 7, and layer 7 serves as an etching mask to delineate predetermined geometrical patterns into the silicon dioxide layer 6, and as an oxidation barrier layer during subsequent growth of silicon dioxide over other parts of the structure. Layer 6 in turn serves as a mask to define patterns in polysilicon layer 5. The oxidation barrier layer material 7 should not oxidize or at most only oxidize extremely slowly relative to the oxidation rate of silicon and polysilicon. The oxidation barrier layer material is considered to be a nonoxidizing material under the conditions to which it is subjected in the method of the present invention. The oxidation barrier layer 7 is preferably a nitride such as silicon nitride and it prevents oxidation of the polysilicon layer 5 thereunder.

A field isolation pattern determining layer such as a layer of resist material 9 of the type employed in known lithographic masking and etching techniques is placed over the surface of the upper silicon dioxide layer 8. Any of the well-known photosensitive polymerizable resist materials known in the art may be used. The resist material is applied as by spinning on or by spraying. The resultant structure is shown in FIG. 4A.

Figure 5A:
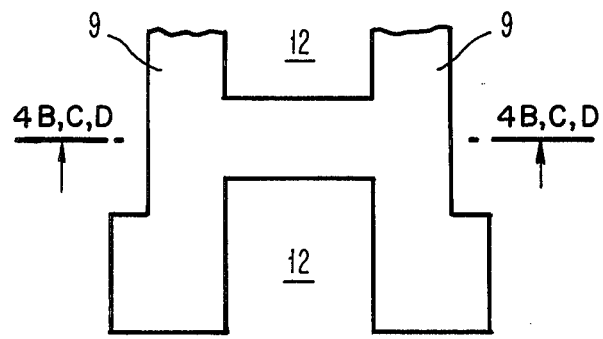
FIGS. 5A–5D show top views of the four basic lithographic masks for the nonoverlapping gate FET employed according to the present invention.

The layer of photoresist material 9 is dried and then selectively exposed to ultraviolet radiation through a photolithographic mask (see FIG. 5A). This mask is of a transparent material having opaque portions in a predetermined pattern. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired predetermined pattern, i.e., it covers the regions in which the FET devices will subsequently be formed.

Figure 4B:
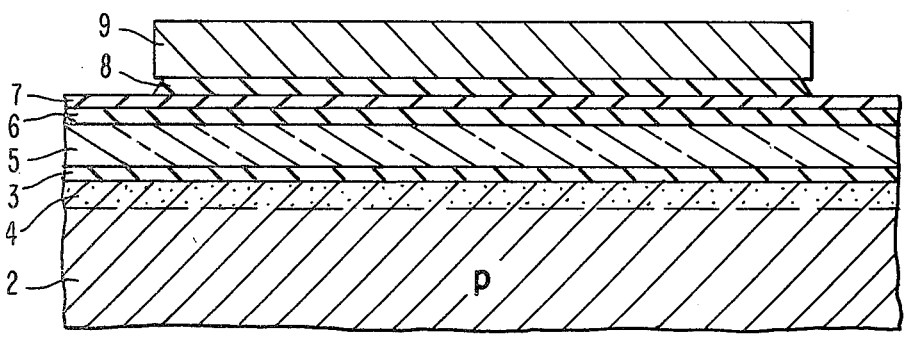

Next the structure is treated to remove the portions of the silicon dioxide 8 not protected by the resist material 9. The wafer is immersed in a solution of buffered hydrofluoric acid. The etching solution dissolves silicon dioxide but does not attack the resist, oxidation barrier layer 7 such as silicon nitride, or other materials of the assembly, as illustrated by FIG. 4B.

Figure 4C:
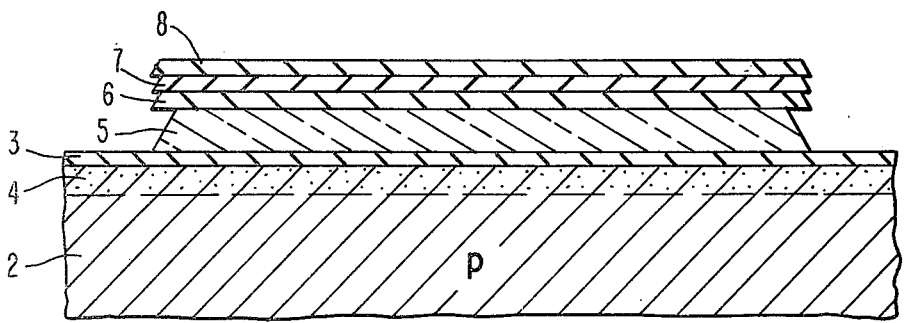

The photoresist material 9 above the etched silicon dioxide 8 is then removed by dissolving in a suitable solvent. The remaining silicon dioxide regions 8 conform to a predetermined pattern, and now serve as a mask for etching predetermined patterns in the oxidation barrier layer 7. Layer 7 then serves as a mask for etching patterns in the thin silicon dioxide layer 6, and layer 6 in turn serves as a mask for etching patterns in the polysilicon layer 5. The resultant structure is shown in FIG. 4C.

Patterns in the layer 7, when silicon nitride is employed, can be formed by etching in a phosphoric acid solution at 180° C. Patterns in the thin oxide layer 6 are formed by etching in a solution of buffered hydrofluoric acid. Patterns in the polysilicon layer 5 are formed by etching in a well-known etchant such as ethylene diamine pyrocatechol at 100° C. This completes the first basic lithographic masking step which delineates the FET device regions as distinguished from the field isolation regions using the mask pattern shown in FIG. 5A. A cross section of the structure at this stage in the process is shown in FIG. 4C.

An important aspect of the present invention is that the channel region, gate insulator, and gate conductor are formed at the initial stage of the fabrication process, thereby protecting the process-sensitive channel region and gate insulator from potentially detrimental effects such as contamination due to chemicals used to etch masking layers, surface damage due to strain induced by pattern defining layers, and exposure to the radiation used to define the lithographic pattern. Another important aspect of the present invention is that the oxidation barrier layer 7, as employed according to the present invention, during subsequent steps also acts as a masking layer for gate pattern definition of the polysilicon layer 5, source/drain doping, and insulation layer growth. This multifunctional aspect of the oxidation barrier layer provides for considerable simplification of the process and facilitates device area reduction. Moreover, since this oxidation barrier layer 7 acts as both the mask for delineating field isolation regions and as a mask for delineating the polysilicon gate, the polysilicon gate and the boundaries of the recessed field isolation silicon dioxide are self-registered with respect to each other. This eliminates the need for the overlap of the polysilicon gate onto the field isolation. Also, as present in the prior art, the doped source and drain regions are self-registered with respect to the ends of the FET.

Figure 4D:
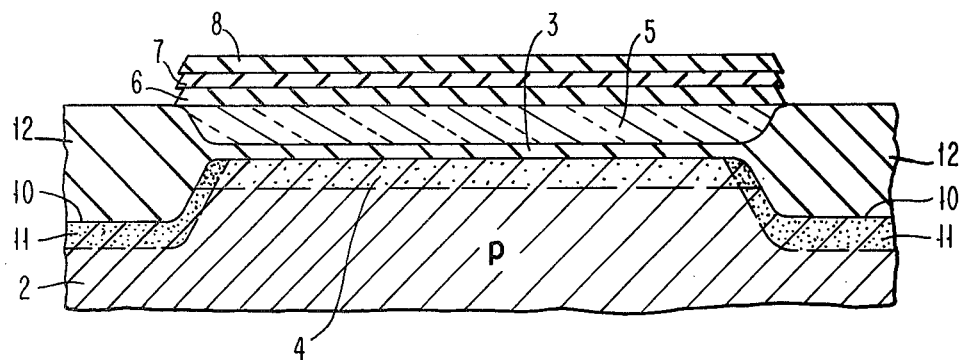

The p-type doping in the field isolation regions 10 can be increased by ion implantation, or by diffusion, of a p-type dopant (see FIG. 4D). This additional doping region 11, referred to as a parasitic channel stopper, serves to increase the voltage required to invert the silicon surface under the subsequently formed silicon dioxide field isolation regions. The use of additional p-type doping for prevention of surface inversion is known in the art and is described, for example, by Dennard, Rideout, and Walker in U.S. Pat. No. 3,899,363.

the channel stopper doping is preferably formed by ion implantation of boron. The boron ion implantation energy is about 65 KeV and the dosage is approximately $2 \times 10^{13}$ cm$^{-3}$. During implantation of the boron, the remaining parts of layers 8, 7, 6, and 5 serve as a blocking mask to prevent implanted boron ions from entering the subsequently formed device regions.

The structure is then subjected to a thermal oxidation to form a partially recessed oxide 12 for isolation in the field regions (see FIG. 4D). The field oxide is approximately 4500 Å thick, and preferably is formed by exposure to water vapor at 1000° C. During this oxidation, silicon in the substrate is converted to silicon dioxide, and consequently silicon dioxide is formed both below and above the original silicon surface, hence the term "partially recessed" oxide. During oxidation, the nitride layer 7 prevents oxidation of the polysilicon layer 5 thereunder. The sides of the polysilicon regions, however, will oxidize; but this oxidation will not reduce the width of the FET channel by way undesirable amount. Oxidation of the sides of the polysilicon layer 5 beneficially insures that the field isolation will be in intimate physical contact with the boundary of the subsequently formed polysilicon gate. By a suitable choice of the polysilicon layer thickness and the field oxide thickness, the field oxide 12 can be grown up level to the upper surface of the polysilicon or up to any other predetermined relative level. A cross section of the resultant structure is shown in FIG. 4D.

It is noted that the predetermined pattern in the polysilicon layer 5 and in the oxidation barrier layer 7 corresponds to the area of the subsequently formed FET devices. Since the partially recessed field isolation abuts the polysilicon layer pattern, that pattern is self-aligned with respect to the field isolation.

Figure 5B:
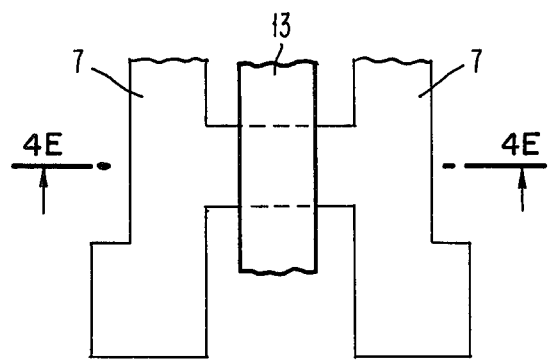

A gate pattern determining layer 13 such as a layer of resist material of the type described previously is placed over the surface of the structure. The resist material is exposed with ultraviolet radiation using a predetermined lithographic masking pattern shown in FIG. 5B, and the unexposed regions of the resist are dissolved away. This is the second basic lithographic masking step. It is noted that the resist material 13 overlaps onto the field isolation 12, but the polysilicon material 5 that will subsequently form the gate does not overlap onto the field isolation. As illustrated in FIG. 5B, the channel region 14 is defined by the orthogonal intersection of two lithographic line (i.e., stripe) patterns which result in a rectangular gate area which may have side dimensions equal to the minimum exposable line width.

Figure 4E:
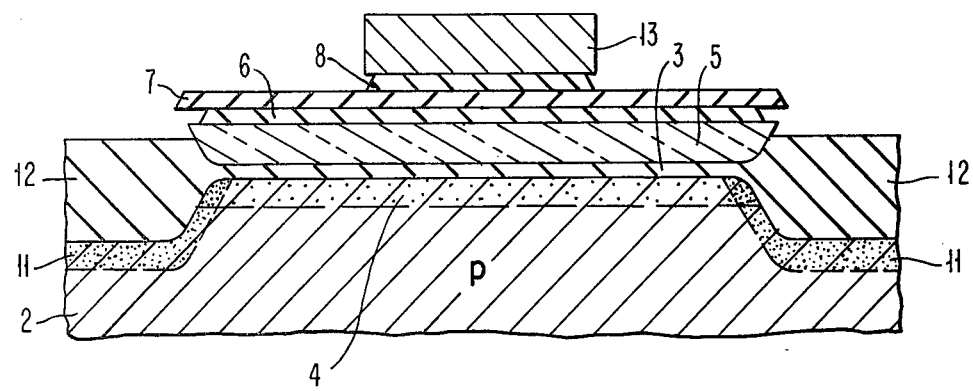

The structure is immersed in a solution of buffered hydrofluoric acid which dissolves silicon dioxide layer 8 but does not attack the resist regions 13 or the oxidation barrier layer 7. During this dissolution step, a relatively small portion of the field isolation oxide is also removed. Although this is undesirable, it is tolerable because the field oxide 12 is much thicker than the oxide layer 8. A cross section of the resultant structure is shown in FIG. 4E. The remaining resist material 13 above the etched silicon dioxide pattern is then removed by dissolving in a suitable solvent. At this stage in the process, the oxidation barrier masking layer 7 has been revealed over the subsequent source and drain regions. The revealed portions of layer 7, when the layer is of silicon nitride, can be removed by etching in a phosphoric acid solution at 180° C. The thin oxide layer 6 under the removed nitride layer 7 can then be removed by a short time or "dip" etch in a solution of buffered hydrofluoric acid. This dip etch also removes a thin layer of oxide from the field isolation 12, but does not reduce the thickness of the field isolation oxide to any undesirable degree. Then the portions of the polysilicon layer 5 over the subsequent source and drain regions are removed by etching in a well known etchant such as ethylene diamine pyrocatechol at 100° C. This etching procedure does not attach other parts of the structure because they are covered by nitride or oxide. The etching step determines the geometrical shape of the polysilicon gate 23.

The n-type source and drain regions are now formed by well known ion implantation or diffusion techniques. For purposes of illustrating the method of the present invention, ion implantation has been selected. For instance, the n-type source and drain regions 15 and 16, respectively, can be formed 2000 Å deep by an $As^{75}$ implantation of about 100 KeV energy and $4 \times 10^{15}$ $cm^{-2}$ dosage. During this source and drain implantation, the polysilicon gate 5, the thin silicon-dioxide layer 6, the oxidation barrier layer 7, and the silicon-dioxide layer 8 act as a blocking mask to prevent the implanted n-type dopant impurities from entering the FET channel region 14 under the polysilicon gate 5. The thick field isolation oxide acts as a blocking mask to prevent n-type impurities from entering the parasitic channel stopper region 11. The resultant cross section after formation of the source and drain regions is shown in FIG. 4F.

Figure 4F:
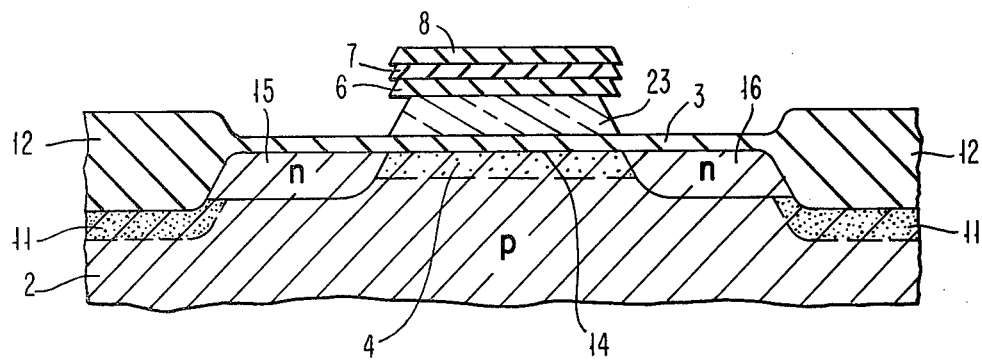

It is noted from FIG. 4F that the boundaries between the n-type source 15 and drain 16 regions, and the channel region 14 of the FET are determined by the edges of the polysilicon gate 23. This feature is generally referred to in the prior art as the "self-aligned gate technique". With the gate self-aligned with respect to the source and drain, the parasitic gate to source and drain overlap capacitances are advantageously reduced over nonself-aligned FET fabrication techniques. In the method of the present invention, the ends of the polysilicon gate are self-aligned with respect to the conductive source and drain regions, while the sides of the gate are self-aligned with respect to the nonconductive field isolation regions.

Next, a dielectric insulation layer 17 is formed above the source and drain regions 15 and 16, respectively. Layer 17 electrically insulates the subsequently formed metallic interconnection line to the gate from the n-type source and drain regions. Formation of layer 17 also advantageously increases the thickness of the field oxide 12' which decreases the capacitive coupling between the metallic interconnection line and the p-type substrate. Accordingly, layer 17 should be as thick as possible, but not so thick that the silicon in the source and drain regions or in the field regions is consumed during oxidation to any undesired extent.

Figure 4G:
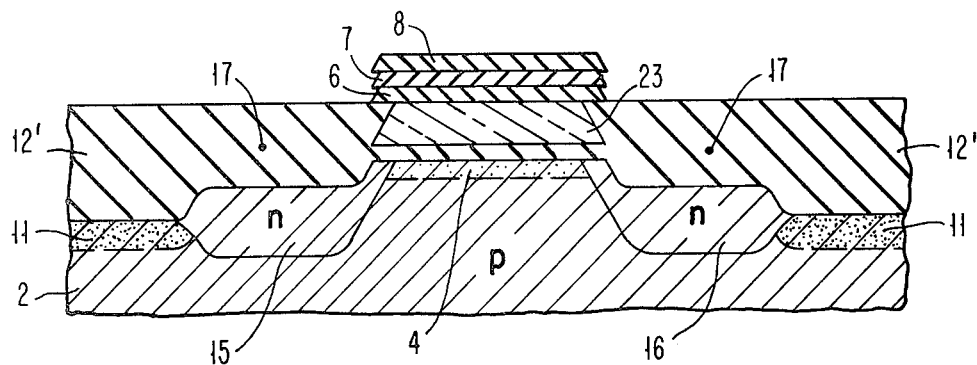

The dielectric insulation 17 over the field regions and over the n-type source and drain regions is formed by growing a silicon dioxide layer 1500 to 5000 Å thick by thermal oxidation at 1000° C. in the presence of steam. During this oxidation, about 600 to 2000 Å of the silicon substrate over the n-type source and drain regions is converted to silicon dioxide. The n-type source and drain regions 15 and 16 are driven down into the substrate and laterally around the growing silicon dioxide as shown in FIG. 4G. Since the silicon dioxide tends to expel n-type dopants, the n-type dopant is not consumed to any significant extent during this oxidation. Also, the lateral diffusion of the n-type source and drain regions does not degrade the electrical characteristics of the FET to any significant degree. The top of the polysilicon gate is protected from oxidation by an oxidation barrier layer 7, whereas the ends of the gate at the source and drain boundaries are subjected to the oxidation, which desirably provides protective insulation up to the oxidation barrier layer 7. During oxidation the thickness of the field oxide 12' is advantageously increased by about 500 to 1500 Å.

Next the polysilicon gates are revealed. First, any part of silicon dioxide layer 8 still remaining is now removed by a short time or "dip" etch in hydrofluoric acid. Next, the oxidation barrier layer 7 over the gates is removed by etching in a phosphoric acid solution at 180° C. Then the thin silicon dioxide layer 6 is removed by dip etching in a buffered hydrofluoric acid solution.

In fabricating FET integrated circuits, electrical connection is made to the FET source and drain regions and to the silicon substrate, as well as to the FET polysilicon gates. In some integrated circuit arrays such as one device cell random access memory arrays, the source and drain connections do not occur in the array of FETs, but are located in the outerlying addressing, decoding, sensing, and clocking circuits referred to as peripheral circuits. In other circuits, such as random logic arrays, the source and drain connections do occur within the array of FETs. The substrate contact is generally not located within the array of FETs. Electrical connection may be made to the top or to the bottom of the semiconductive substrate 2. Preferably, electrical connection is made to the top of the semiconductive substrate with the same pattern delineating steps that provide electrical connection to the source and drain regions, and is made concurrently therewith.

The source, drain, and substrate connection are made by applying a resist layer to the assembly. The resist material is exposed with ultraviolet radiation using a predetermined lithographic masking pattern shown in FIG. 5C and the unexposed regions of the resist are dissolved away. This is the third basic lithographic masking pattern defining operation. Next, the structure is treated to remove the portions of the thick silicon dioxide not protected by the resist material. The wafer is immersed in a solution of buffered hydrofluoric acid to provide contact holes or vias 18, 19, and 20 through the insulation and field oxide layers to allow electrical connection to be made to the source, drain and substrate, respectively.

Figure 4H:
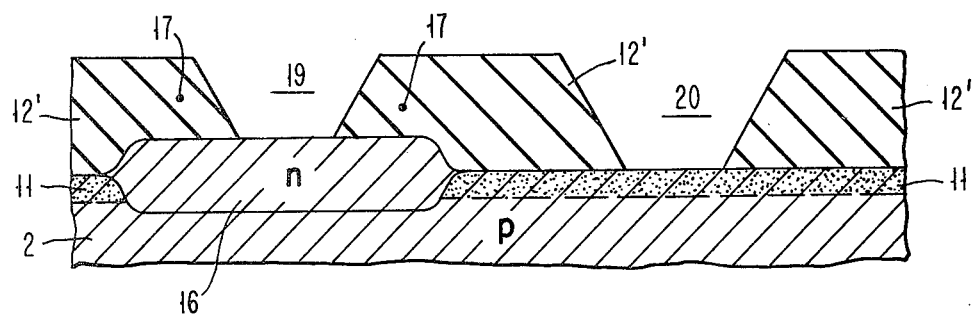
Figure 5C:
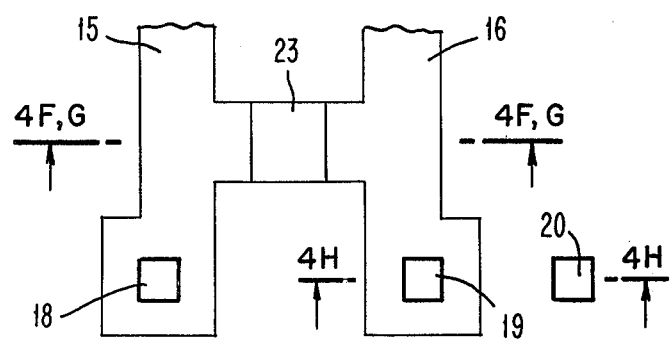

The remaining resist above the etched silicon dioxide is then removed by dissolving in a suitable solvent. At this stage in the process the polysilicon gates and the source and drain and substrate regions in the contact holes 18, 19 and 20, respectively, have been revealed for contacting. The sequence of removing nonoxidizing layer 7, and then etching contact holes 18, 19, and 20 may be reversed without significantly affecting the final structure. A cross section of the structure through the line indicated in FIG. 5C is shown in FIG. 4H.

Next, the metallic-type highly conductive interconnection line material, 21, preferably a metal, is deposited. An example of a highly-conductive material commonly used for interconnection is aluminum which may contain relatively small amounts of impurities introduced to decrease electromigration effects or to prevent or reduce chemical reactions between the aluminum and the semiconductive material to be contacted. The highly-conductive material such as aluminum may be deposited by sputtering or preferably by evaporation.

It is noted that a barrier layer (not shown) may be placed between the aluminum and the silicon or polysilicon layers to prevent or reduce chemical reaction between the aluminum and the semiconductive material. The barrier layer may be of a metal such as titanium or chromium, or of an intermetallic silicide such as platinum silicide or palladium silicide.

Next, a photoresist layer is applied to the structure. The resist material is exposed with ultraviolet radiation using a predetermined lithographic masking pattern shown in FIG. 5D and the unexposed regions of the resist are dissolved away. This is the fourth basic lithographic masking operation. Then the structure is treated to remove the portions of the conductive material not protected by the resist pattern shown in FIG. 5D. When a barrier layer is employed under the conductive material, the pattern in the conductive material can serve as an etching mask for delineating the barrier layer.

Figure 2C:
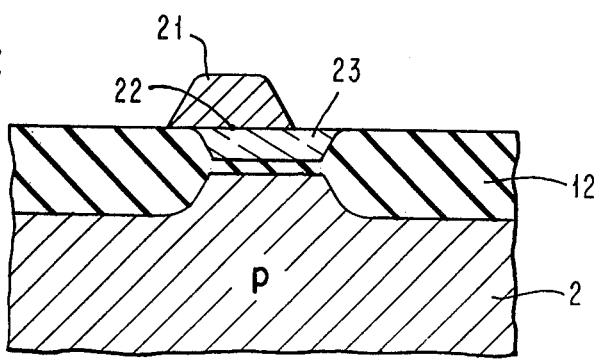
Figure 4I:
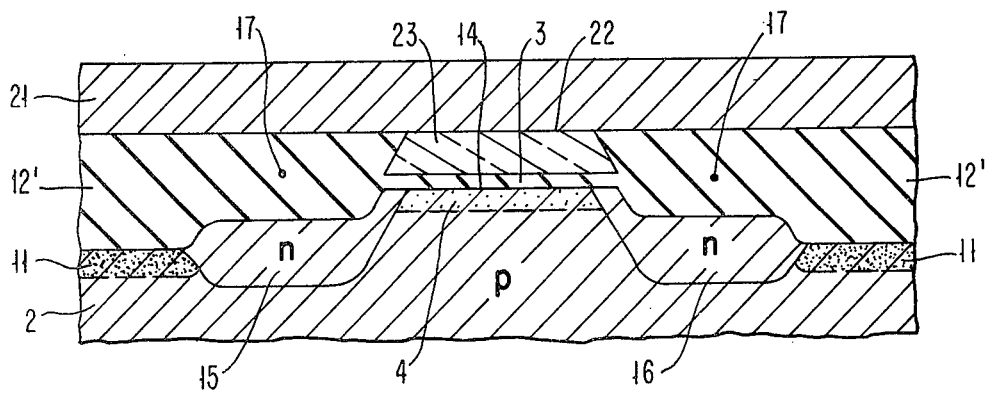
Figure 5D:
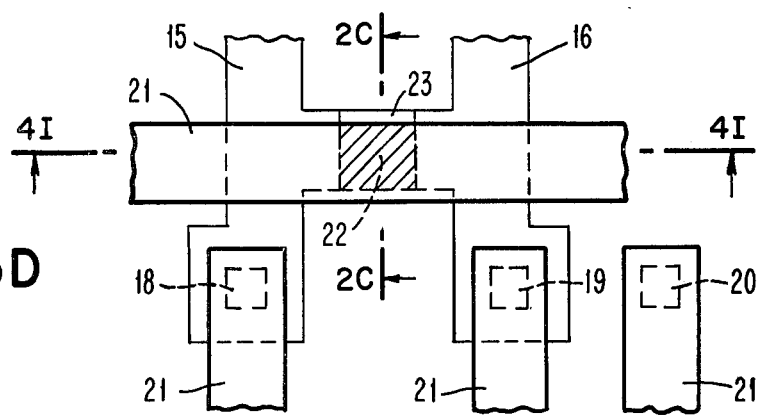

FIG. 5D illustrates a top view of an FET and representative metallic interconnection lines making a self-registered electrical connection 22 to the polysilicon gate 23, and conventional contact through holes or vias 18, 19, and 20 to n-type doped source and drain regions, and to p-type substrate regions, fabricated according to the present invention. A cross sectional view through the channel from source to drain of the final FET structure of FIG. 5D is shown in FIG. 4I and in FIG. 2B. A cross sectional view across the channel of the FET of FIG. 5D is shown in FIG. 2C.

In other FET processes that use a conventional etched contact hole for connection between the metallic interconnection line and the polysilicon gate, extreme precision in registration between the polysilicon gate lithographic mask and the gate contact hole lithographic mask is required. Furthermore, in the conventional approach, since only that portion of the gate revealed by the hole is available for contacting, precise registration between the gate contact hole lithographic mask and the metallic interconnection line lithographic mask is also required. In the "self-registering" gate contact method employed in the present invention, the entire polysilicon gate area is revealed for contacting and the conductive material need merely to cross over any portion of the polysilicon gate in order to make electrical connection. Accordingly, this misregistration tolerant aspect of the present invention considerably reduces the required degree of registration precision between the polysilicon gate, contact hole, and interconnection line lithographic masks.

As known in the art, additional layers (not shown) may be provided over the metallic-type layer 21 such as sputtered silicon dioxide for the purpose of passivating the integrated circuit. Furthermore, as is known in the art, when desired, other masking steps may be used to provide vias through the passivation layer in order to make contact to the metallic interconnection layer or to the semiconductive substrate. In addition, when desired, electrical connection may be made to the back surface of the semiconductive substrate. Also, in addition to the photolithographic exposure technique using ultraviolet radiation described previously, the method of the present invention can utilize other lithographic masking (pattern delineating) techniques that use electronbeams, X-rays, or other radiation for exposure. Both p-channel and n-channel transistors FETs may be fabricated with the method of the present invention. Examples of integrated circuits that may be fabricated using the new FET structure of the present invention include random access logic arrays, programmable logic arrays, read-only memory arrays, sequentially accessed memory arrays, random access memory arrays, shift register arrays, bucket brigade shift register array, charge coupled shift register arrays, and random access arrays of one-device memory cells.

One-device memory cells include a single field-effect transistor (FET) switch and a conductor-insulator-semiconductor information storage capacitor. The FET is used to switch electronic charges (electrons) representing information into and out of the capacitor. Typically the charge storage capacitor is operated in two states, charged and uncharged, representing a binary "1" and "O". The upper electrode of the storage capacitor can be referred to as the plate of the one-device cell.

A particular type of one-device memory cell to which the present invention is advantageously directed is the one-device memory cell wherein the storage capacitor includes a doped lower capacitor electrode beneath a separately delineated polysilicon upper capacitor electrode as described by Rideout in pending U.S. patent application Ser. No. 656,756 entitled "FET One-Device Memory Cells with Two Layers of Polycrystalline Silicon and Fabrication of Integrated Circuits Containing Arrays of the Memory Cells" and filed Feb. 9, 1976. Such an FET one-device memory cell using an FET of the present invention and a second and separately defined polysilicon upper storage electrode is shown in FIG. 6. In order to fabricate such a one-device cell, an additional masking operation is required to delineate the charge storage capacitor plate in a second polysilicon layer. The additional steps for fabricating such a one-device cell include providing a capacitor insulator 25, and depositing and doping a second and subsequent layer of polysilicon above the capacitor insulator. The second and subsequent layer of polysilicon is delineated to provide electrode regions 26 above the corresponding doped lower electrodes 27 of the storage capacitors. The upper polysilicon electrode region is extended to cover a plurality of doped lower electrodes. These steps are carried out after thermally diffusing or ion implanting active impurities of the second and opposite type into predetermined regions of the semiconductive substrate to provide the FET source 15 and drain 16 regions. This thermal diffusing or ion implanting step also provides the doping impurities for providing the lower electrodes of the storage capacitors.

The n-type source, drain, and lower capacitor electrode are formed by ion implantation or diffusion after delineating the polysilicon gate, but before delineating the polysilicon upper capacitor electrode (plate). The ion implantation or thermal diffusion must be carried out before the step of depositing the second polysilicon layer in order to form an n-type lower capacitor electrode under the polysilicon capacitor upper electrode.

In particular, a thin storage capacitor insulator of silicon dioxide about 200 to 1000 Å thick is formed by thermal oxidation of the silicon surface in the presence of dry oxygen. Then the second and subsequent polysilicon layer is approximately 3500 to 5000 Å thick and may be formed by chemical-vapor deposition. The polysilicon is doped with $POCl_3$ as described hereinabove. After doping, a layer of silicon dioxide 500 to 1000 Å thick is grown on or is deposited onto the second polysilicon layer. Preferably the silicon dioxide is deposited by conventional chemical-vapor deposition techniques. The residual of the POCl₃ layer need not be removed prior to forming such a silicon dioxide layer.

A layer of resist material of the type described previously for defining the gate pattern is used to define the polysilicon upper capacitor electrode (plate) pattern. The resist material is applied, exposed with UV radiation using a predetermined lithographic mask pattern, and the unexposed regions of the resist are dissolved away. Next, the structure is treated to remove the portions of the silicon dioxide 8 not protected by the resist material.

The wafer is immersed in a solution of buffered hydrofluoric acid which dissolves silicon dioxide layer but does not attack resist, oxidation barrier layer such as silicon nitride, silicon, or other materials of the assembly. The remaining photoresist above the etched silicon dioxide pattern is then removed by dissolving in a suitable solvent. The remaining silicon dioxide conforms to a predetermined capacitor storage plate pattern. The patterns in the polysilicon plate layer are formed by etching in a well-known etchant such as ethylene diamine pyrocatechol at 100° C. The etchant does not attack the polysilicon gate regions which are covered on the sides with a protective layer of silicon dioxide and on the top with an oxidation barrier layer and oxide layer, because the etchant does not attack silicon dioxide or silicon nitride. The defining layer of silicon dioxide over the polysilicon plate regions is preferably retained since it enhances the thickness of the dielectric insulation over the plate.

If desired, an additional n-type implantation or diffusion may be performed at this time to increase the electrical conductivity of the source regions and of the drain regions (n-type bit lines). If utilized, this additional n-type doping will not enhance the conductivity of the lower electrode of the capacitor due to the blocking action of the polysilicon upper capacitor electrode and silicon dioxide layer.

By following the present invention, FETs are obtainable which are smaller than prior art FETs since the polysilicon gate and oxide isolation regions are self-registered with each other, thereby eliminating the need for overlap of the polysilicon on the oxide isolation. This in turn can lead to higher device packing density. Because the polysilicon gate material abuts the field isolation, and because of the misregistration tolerant aspect of the self-registering gate connection technique, the gate contact area is a relatively small fraction of the overall area of the FET and its associated field isolation regions. The gate contact is made over the gate, and hence over the channel. This vertical placement of electrical connection to the metallic line over the gate and over the channel yields an FET with an overall area smaller than that possible with other FET fabrication techniques. The number of basic lithographic masking (pattern delineating) steps, however, is no greater than that used in other FET integrated circuit fabrication processes.

As described hereinabove, the present invention involves forming lithographic patterns twice in the same polysilicon layer using the same oxidation barrier masking layer and two separate lithographic masking steps. The first lithographic pattern delineates the field insulation regions, and the next pattern delineates the gate regions wherever two patterns overlap (i.e., wherever they delineate a common area). These two patterns consist of orthogonally crossed stripes (i.e., lines) that will yield a small square of polysilicon which will become the FET gate. The repeated delineation of a single oxidation barrier masking layer results in a reduction in the number of layers and process fabrication steps, thereby simplifying the process over other FET fabrication processes that utilize both recessed oxide field isolation and self-registering gate contacts.

Another advantage of the present invention is that the channel region, gate insulator, and gate conductor are determined at the initial stage of the fabrication process, thereby protecting the process-sensitive channel region and gate insulator from potentially detrimental effects such as contamination due to chemicals used to etch masking layers, surface damage due to strain induced by pattern defining layers and exposure to the radiation used to define the lithographic patterns.

A further advantage of the present invention is that the insulation oxide is grown up level to the upper surface of the gate on all sides of the gate, thereby providing a highly planar surface topology upon which to delineate the metallic interconnection pattern. Also, since the entire upper surface of the gate is revealed for contacting, in effect a very large gate contact area (i.e., "via") is provided, and consequently the interconnection lithographic pattern need not be very precisely registered with respect to the gate lithographic pattern.

Another advantage of the present invention is that electrical connection to the semiconductive substrate can be made using the pattern delineating steps that provide electrical connection to FET source and drain regions when the thickness of the field isolation oxide is not significantly different from that of the thermal insulation oxide over the sorce and drain regions.

Figure 7:
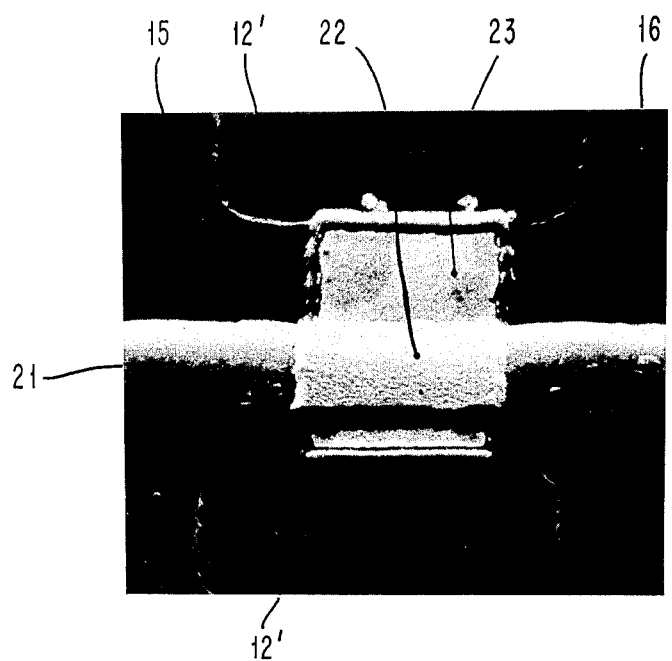
FIG. 7 shows a scanning electron microscope photograph of an FET made according to the method of the present invention.

FIG. 7 shows a scanning electron microscope photograph of an experimental FET made according to the method of the present invention. The surface topology of the structure shown in FIG. 7 is highly planar and the aluminum interconnection line 21 exhibits only a slight undulation as it crosses the polysilicon gate 23 and makes a self-registered electrical connection 22. Furthermore, the gate is self-aligned to both the conductive source 15 and drain 16 regions as well as to the nonconductive field isolation regions 12'.

Figure 8:
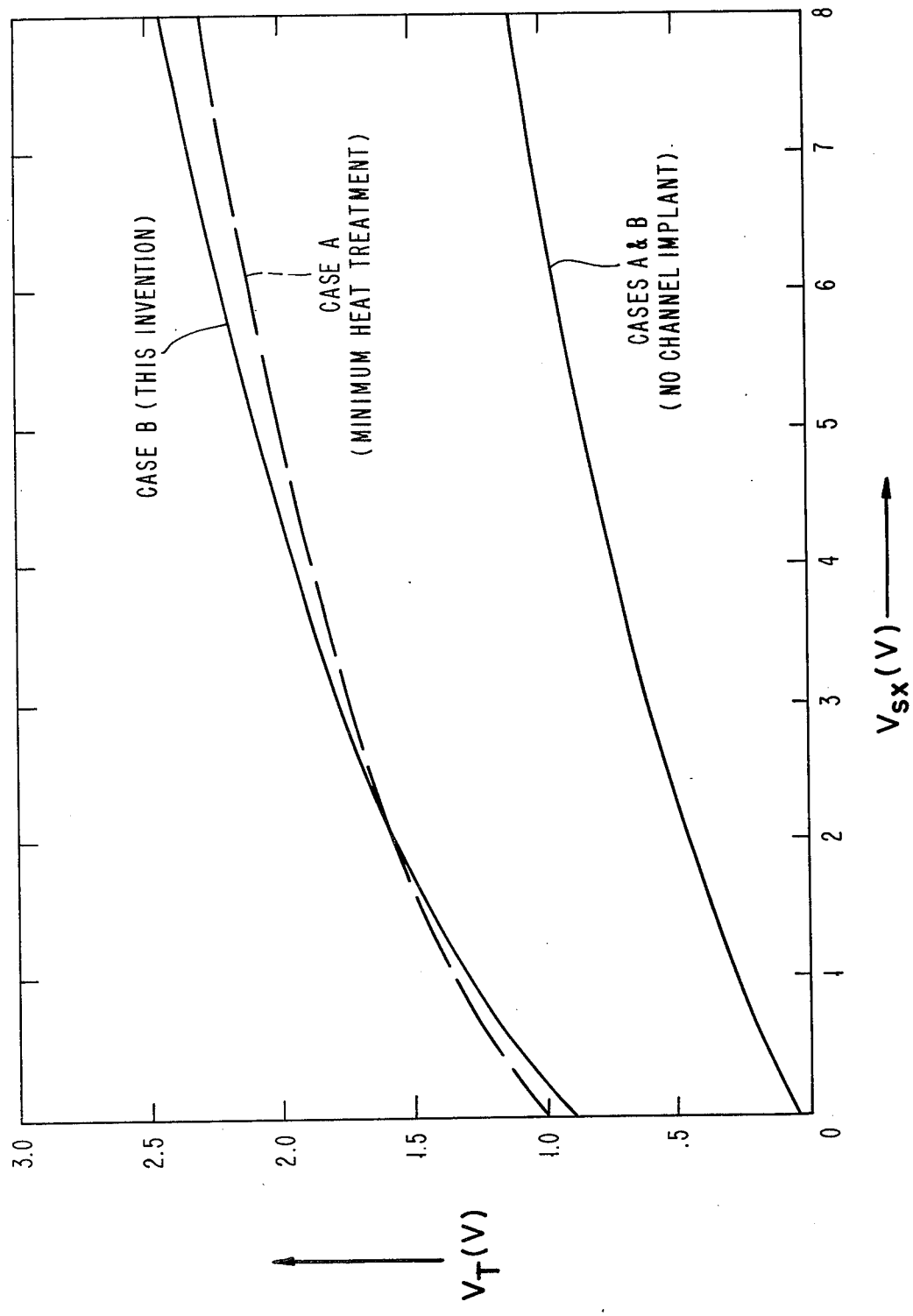
FIG. 8 shows a threshold voltage versus source-to-substrate ("back-gate") bias characteristic of an FET of the present invention.

According to the present invention, the channel implantation for threshold adjustment is performed prior to growth of the field isolation oxide and to growth of the insulation oxide over the source and drain. A concern associated with this approach is that the channel implantation could be spread out so broadly that the substrate sensitivity (i.e., the gate threshold voltage, $V_t$, versus source-to-substrate "back-gate" bias, $V_{sx}$, characteristic) would be seriously impaired. FIG. 8 shows the substrate sensitivity of an FET fabricated according to the present invention with the channel implant preceding the gate oxide growth, which is the worst possible case for this potential problem. For comparison, FIG. 8 also shows the substrate sensitivity of an FET fabricated in a more conventional manner in which the channel implant is performed after the field oxide growth and after the gate insulation growth and with a minimum of high temperature heat treatments as described by Dennard et al in "Design of Ion-Implanted MOSFET's with Very Small Physical Dimensions", IEEE Journal of Solid-State Circuits, Volume SC-9, Number 5, pp. 256–68, October 1974. FIG. 8 shows that the substrate sensitivity of FETs fabricated according to the present invention is not seriously degraded by the high temperature heat treatments.

Figure 9:
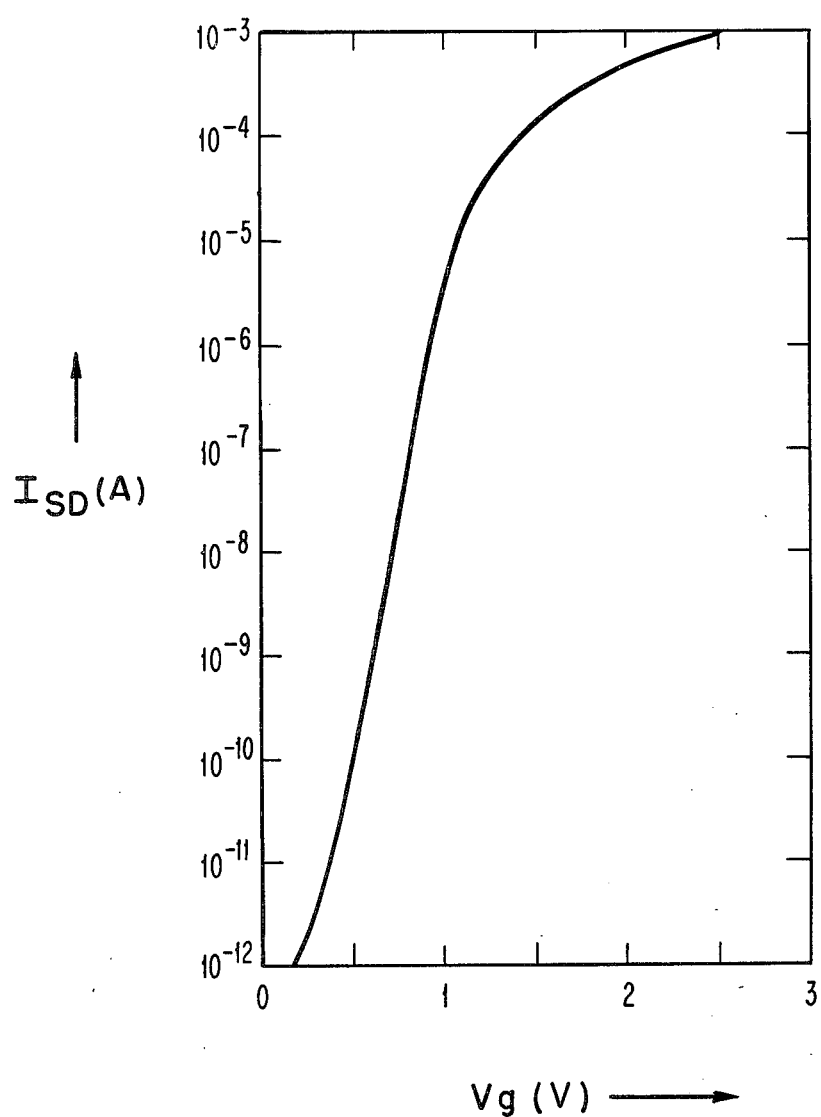
FIG. 9 shows a semilogarithmic source current versus gate voltage characteristic of an FET of the present invention.

FIG. 9 shows an experimental semilogarithmic source to drain, $I_{SD}$, current versus gate voltage, $V_g$, characteristic of an FET made according to the present invention. This subthreshold conduction characteristic illustrates that the devices turn off to acceptably low enough values of current (i.e., less than $10^{-12}$ amperes) and that source to drain leakage currents at zero gate voltage will not be of concern in fabricating one-device memory cells.

Figure 10:
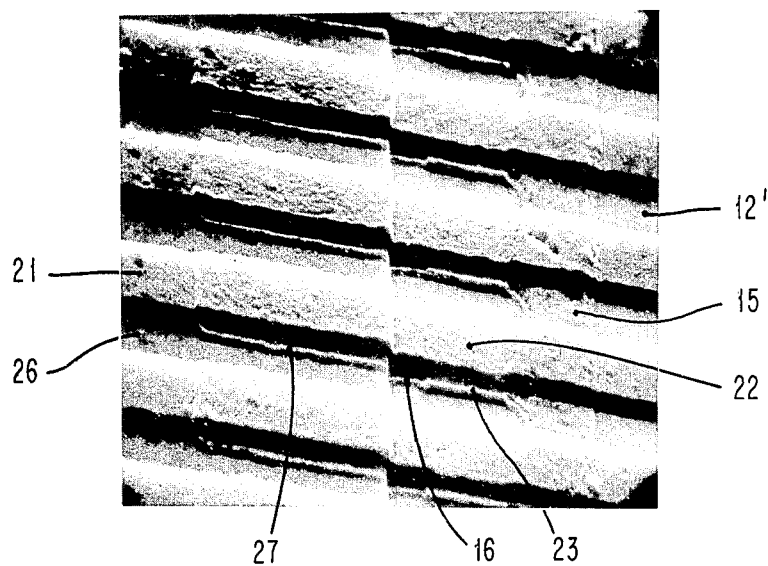
FIG. 10 shows a scanning electron microscope photograph of FET one-device memory cells employing FETs of the present invention.

FIG. 10 shows a scanning electron microscope photograph of an experimental FET one-device cell memory array employing FETs of the present invention, and a second layer of polysilicon to provide the upper electrode of the storage capacitor as described hereinabove, and as illustrated in FIG. 6.

What is claimed is:

1. A method for fabricating an integrated circuit containing an array of FETs having recessed field oxide isolation between FETs, and associated FET circuits peripheral to the array of FETs but on the same semiconductive substrate, and wherein FETs of the array have a channel region; a gate insulator; a doped polycrystalline silicone gate self-aligned to the field oxide isolation on the sides of the gate in the width direction, the gate neither overlapping nor underlapping the field oxide isolation; source and drain regions being self-aligned to the ends of the gate in the length direction; insulation over the source and drain but not over the gate; metallic-type high electrical conductivity interconnection line; and self-registering electrical connection between the gate and the interconnection line which comprises:

(A) providing a semiconductive substrate of a first conductive type containing active impurities of a first conductive type;

(B) providing an insulator layer on said substrate, which insulator layer is to be subsequently delineated to provide the gate insulator;

(C) depositing a layer of polycrystalline silicon above the insulator layer;

(D) depositing an oxidation barrier layer above said polycrystalline silicon layer;

(E) delineating by masking and etching first predetermined polycrystalline silicon regions to provide the device area;

(F) growing in the etched regions isolation oxide recessed into the substrate to provide insulating field oxide regions between FETs of the array;

(G) delineating by masking and etching second predetermined polycrystalline silicon regions to provide polycrystalline silicon gate regions of the FETs;

(H) thermally diffusing or ion implanting active impurities of a second and opposite type into preselected regions of the semiconductive substrate to provide FET source and drain regions;

(I) thermally growing a silicon dioxide insulating layer over regions of the structure but not over the polycrystalline silicon FET gates which are still protected by an oxidation barrier layer;

(J) removing existing oxidation barrier layer from over the FET gates by use of an etchant;

(K) delineating contact holes to provide vias for achieving electrical connection between metallic interconnection lines and FET source and drain regions;

(L) depositing and delineating a metallic-type high conductivity electrical interconnection pattern that makes electrical connection to the polycrystalline silicon FET gates; and to FET source and drains; and (M) providing electrical connection to said semiconductive substrate.

2. The method of claim 1 wherein said semiconductive substrate is a p-type silicon substrate containing active p-type impurities.

3. The method of claim 2 wherein said p-type impurities are selected from the group consisting of boron, aluminum, gallium, and indium.

4. The method of claim 1 wherein said recessed oxide isolation regions are of silicon dioxide.

5. The method of claim 1 wherein said recessed oxide isolation regions are about 4,000 to about 10,000 Å in thickness.

6. The method of claim 1 which further includes implanting or diffusing active impurities of said first type in said etched field regions to provide parasitic channel stopper regions beneath and beside the recessed oxide isolation regions; said channel stopper impurities having been provided prior to growing the field isolation oxide.

7. The method of claim 6 wherein the concentration of active impurities contained in said channel stopper region is greater than the concentration of active impurities in the semiconductive substrate.

8. The method of claim 1 wherein said gate insulator is a layer of silicon dioxide.

9. The method of claim 8 wherein said silicon dioxide gate insulator is about 200 to about 1000 Å in thickness.

10. The method of claim 1 wherein said polycrystalline silicon FET gate region is about 1500 to about 5000 Å in thickness.

11. The method of claim 1 wherein said polycrystalline silicon FET gate is of a second conductive type.

12. The method of claim 1 wherein said active impurities of a second conductive type are an n-type dopant.

13. The method of claim 12 wherein said n-type dopant is arsenic, phosphorous or antimony.

14. The method of claim 1 wherein said oxidation barrier layer in step (D) is of silicon nitride.

15. The method of claim 14 wherein said silicon nitride is about 500 to about 1000 Å in thickness.

16. The method of claim 1 wherein said silicon dioxide insulating layer grown in step (I) is about 1500 to about 5000 Å in thickness.

17. The method of claim 1 wherein the interconnection material is a metal.

18. The method of claim 17 wherein said metal is aluminum.

19. The method of claim 18 which further includes providing a barrier layer between said aluminum and said silicon or polycrystalline silicon to at least reduce chemical reaction therebetween.

20. The method of claim 19 wherein said chemical reaction barrier layer is a metal other than aluminum, or is an intermetallic silicide.

21. The method of claim 20 wherein said chemical reaction barrier layer is of titanium or chromium.

22. The method of claim 20 wherein said chemical reaction barrier layer is of platinum silicide or palladium silicide.

23. The method of claim 1 which further includes implanting or diffusing active impurities of said first type in the channel region to provide a higher doping concentration in said channel region as compared to the doping concentration of the semiconductive substrate.

24. The method of claim 23 wherein the implanting or diffusing in the channel region is carried out prior to step (B) of providing insulation layer on the substrate.

25. The method of claim 23 wherein the implanting or diffusing in the channel regions is carried out subsequent to step (B) of providing insulation layer on the substrate.

26. An integrated circuit prepared by the method of claim 1.

27. A method for fabricating an integrated circuit containing an array of FET one-device memory cells having recessed field oxide isolation between cells and associated FET addressing, sensing, decoding, and clocking circuits peripheral to the array of memory cells and wherein memory cells of the array have a channel region; a gate insulator; a doped polycrystalline silicon gate; a charge storage capacitor consisting of a polysilicon upper electrode, a capacitor insulator and a silicon lower electrode beneath the upper electrode; self-alignment between field oxide isolation and the sides of the gate in the width direction, the gate neither overlapping nor underlapping the field oxide isolation; source and drain regions being self-aligned to the ends of the gate in the length direction; insulator over the source and drain but not over the gate; metallic-type high electrical conductivity interconnection line; and self-registering electrical connection between the gate and the interconnection line which comprises:

(A) providing a semiconductive substrate of p-conductive type containing active impurities of p-type;

(B) providing insulator layer on said substrate, which insulator layer is to be subsequently delineated to provide the gate insulator;

(C) depositing a first layer of polycrystalline silicon above the gate insulator layer;

(D) depositing an oxidation barrier layer above said first polycrystalline silicon layer;

(E) delineating by masking and etching first predetermined polycrystalline silicon regions to provide the device area;

(F) growing in the etched regions isolation oxide recessed into the substrate to provide insulating field oxide regions between memory cells of the array;

(G) delineating by masking and etching second predetermined polysilicon regions in said first polysilicon layer to provide polysilicon gate regions of the memory cells;

(H) thermally diffusing or ion implanting active impurities of a second and opposite type into preselected regions of the semiconductive substrate to provide FET source regions. FET drain regions, and lower electrodes of the storage capacitors;

(I) providing a capacitor insulator;

(J) then depositing a second and subsequent layer of polysilicon above the capacitor insulator;

(K) then delineating the second and subsequent polysilicon layer to provide predetermined polysilicon upper electrode regions above the corresponding doped lower electrodes of the storage capacitors;

(L) thermally growing a silicon dioxide insulating layer over regions of the structure but not over the polycrystalline silicon FET gates which are still protected by an oxidation barrier layer;

(M) removing the existing oxidation barrier layer from over the FET gates by use of an etchant;

(N) delineating contact holes to provide vias for achieving electrical connection between metallic interconnection lines and polysilicon upper capacitor electrodes; source and drain regions in circuits peripheral to the array of memory cells;

(O) depositing and delineating a metallic-type high-conductivity electrical interconnection pattern that makes electrical connection to the polysilicon FET gates in the array of memory cells; to polysilicon upper capacitor electrodes; and to FET sources, gates, and drains in circuits peripheral to the array of memory cells; and (P) providing electrical connection to said semiconductive substrate.

28. The method of claim 27 wherein said semiconductive substrate is a p-type silicon substrate containing active p-type impurities.

29. The method of claim 28 wherein said p-type impurities are selected from the group consisting of boron, aluminum, gallium, and indium.

30. The method of claim 27 wherein said gate insulator is a layer of silicon dioxide.

31. The method of claim 27 wherein said capacitor insulator is a layer of silicon dioxide.

32. The method of claim 27 wherein said polycrystalline silicon FET gate is of a second conductive type.

33. The method of claim 27 wherein said active impurities of a second conductive type are an n-type dopant.

34. The method of claim 33 wherein said n-type dopant is arsenic, phosphorus or antimony.

35. The method of claim 27 wherein said oxidation barrier layer in step (D) is of silicon nitride.

36. The method of claim 27 wherein said second and subsequent layer of polysilicon is of a second conductive type.

37. The method of claim 27 which further includes depositing an ozide layer on said second and subsequent layer of polysilicon.

38. The method of claim 27 which further includes implanting or diffusing active impurities of said first type in said etched field regions to provide parasitic channel stopper regions beneath and beside the recessed oxide isolation regions, said channel stopper impurities having been provided prior to growing the recessed field isolation oxide.

39. The method of claim 38 wherein the concentration of active impurities contained in said channel stopper region is greater than the concentration of active impurities in the semiconductive substrate.

40. An integrated circuit prepared by the method of claim 27.

41. The method of claim 1 which further comprises delineating contact holes to provide vias for achieving electrical connection between metallic interconnection lines and regions of the semiconductive substrate.

42. The method of claim 1 wherein step (K) of claim 1 also provides for delineating contact holes to provide vias for achieving electrical connection between metallic interconnection lines and regions of the semiconductive substrate.

43. The method of claim 27 which further comprises delineating contact holes to provide vias for achieving electrical connection between metallic interconnection lines and regions of the semiconductive substrate.

44. The method of claim 27 wherein step (N) of claim 90 also provides for delineating contact holes to provide vias for achieving electrical connection between metallic interconnection lines and regions of the semiconductive substrate.

* * * * *

UNITED STATES PATENT AND TRADEMARK OFFICE
CERTIFICATE OF CORRECTION

PATENT NO. : 4,160,987
DATED : July 10, 1979
INVENTOR(S) : Robert H. Dennard et al.

It is certified that error appears in the above-identified patent and that said Letters Patent are hereby corrected as shown below:

Column 9, line 18, change "overlapping" to --nonoverlapping--.

Column 11, line 43, after "having", change "an" to --a--.

Column 14, line 20, change "way" to --any--.

Column 18, line 6, change "array" to --arrays--.

Claim 27, line 4 of paragraph (H), change the period (.) after "regions" to a comma (,).

UNITED STATES PATENT AND TRADEMARK OFFICE
CERTIFICATE OF CORRECTION

PATENT NO. : 4,160,987

DATED : July 10, 1979

INVENTOR(S) : Robert H. Dennard et al.

It is certified that error appears in the above—identified patent and that said Letters Patent is hereby corrected as shown below:

Claim 44, line 2, change the dependency from "90" to -- 27 --.

Signed and Sealed this

Tenth Day of June 1980

[SEAL]

Attest:

SIDNEY A. DIAMOND

Attesting Officer

Commissioner of Patents and Trademarks